(12) United States Patent
Park

(10) Patent No.: US 7,579,871 B2
(45) Date of Patent: Aug. 25, 2009

(54) CURRENT DRIVE CIRCUIT AND METHOD OF BOOSTING CURRENT USING THE SAME

(75) Inventor: Dong-Uk Park, Seoul (KR)

(73) Assignee: Samsung Electronics Co. Ltd., Suwon-Si (KR)

( * ) Notice: Subject to any disclaimer, the term of this patent is extended or adjusted under 35 U.S.C. 154(b) by 46 days.

(21) Appl. No.: 11/363,338

(22) Filed: Feb. 27, 2006

(65) Prior Publication Data
US 2006/0214690 A1 Sep. 28, 2006

(30) Foreign Application Priority Data
Mar. 22, 2005 (KR) ...................... 10-2005-0023450

(51) Int. Cl.
*H03K 19/0175* (2006.01)
*H03B 1/00* (2006.01)
(52) U.S. Cl. .............................. 326/83; 326/87; 326/82; 326/86; 327/108; 327/109
(58) Field of Classification Search .................. 326/83, 326/82, 86
See application file for complete search history.

(56) References Cited
U.S. PATENT DOCUMENTS
5,248,907 A * 9/1993 Lin et al. ....................... 326/33
6,326,811 B1 * 12/2001 Coddington et al. .......... 326/83
6,411,146 B1 6/2002 Kuo
6,664,805 B2 * 12/2003 Gonzalez ..................... 326/26
6,738,914 B2 5/2004 Christopher

FOREIGN PATENT DOCUMENTS
JP 2003 0263251 9/2003

OTHER PUBLICATIONS
Inventor: Nakatsuka Tetsushi, Title: Information processing apparatus with radio communication function, Date: Nov. 3, 2002. English Abstract.

* cited by examiner

*Primary Examiner*—Rexford N Barnie
*Assistant Examiner*—Thienvu V Tran
(74) *Attorney, Agent, or Firm*—F. Chau & Associates, LLC

(57) ABSTRACT

A current drive circuit includes a differential voltage detector configured to detect a voltage level of a drive node and configured to compare the voltage level of the drive node with a voltage level of a reference voltage to generate a comparison signal, a control logic circuit configured to generate a control signal to provide a current to the drive node based on the comparison signal, and a current driver configured to provide the current to the drive node or provide the current from the drive node based on the control signal. The voltage level of the drive node rapidly reaches the voltage level of the reference voltage.

16 Claims, 9 Drawing Sheets

CURRENT DRIVE CIRCUIT AND METHOD OF BOOSTING CURRENT USING THE SAME

CLAIM FOR PRIORITY

This application claims priority to Korean Patent Application No. 2005-23450 filed on Mar. 22, 2005 in the Korean Intellectual Property Office, the contents of which are hereby incorporated by reference.

BACKGROUND OF THE INVENTION

1. Field of the Invention

The present invention relates to a current drive circuit, and in particular, to a current drive circuit of a current mode bus interface system and a method of boosting a current using the same.

2. Description of the Related Art

Typically, to transmit/receive signals between integrated circuits, either a voltage mode transmitting/receiving operation or a current mode transmitting/receiving operation is performed.

The voltage mode transmitting/receiving operation has a resistive-capacitive delay, and the current mode transmitting/receiving operation has been studied to improve the voltage mode transmitting/receiving operation.

The current mode transmitting/receiving operation observes a current of a transmitted/received signal. The current mode transmitting/receiving operation maintains a voltage level of a transfer line at a predetermined level, and transfers data by changing a level of a current flowing through the transfer line.

A transmitter may sequentially transfer digital data using two logic levels '1' and '0'. For example, a current level of about 17 mA through 23 mA may be set to logic level '1', and the current level of about 0 mA through 6 mA may be set to logic level '0'. At this time, a receiver may recover the transmitted digital data by determining the current level of the transmitted signals.

The current mode transmitting/receiving operation may reduce the resistive-capacitive delay since the voltage level is maintained at the predetermined level.

In the current mode transmitting/receiving operation, the transmitter may transmit a reference current with a data current. For example, the transmitter sets the current level of about 17 mA through 23 mA to logic level '1', sets the current level of about 0 mA through 6 mA to logic level '0', and transmits the data current based on the logic levels. At the same time, the transmitter transmits the reference current of about 10 mA.

The receiver receives both the data current and the reference current to compare a magnitude of the data current with that of the reference current, and then, determines the logic level of the transmitted data current. For example, the receiver determines the transmitted digital data as logic level '1' when the magnitude of the data current is larger than that of the reference current, and determines the transmitted digital data as logic level '0' when the magnitude of the data current is smaller than that of the reference current.

As described above, the current mode transmitting/receiving operation that transmits/receives both the data current and the reference current is called a 'pseudo-differential current mode' transmitting/receiving operation.

It is desired that the mobile applications efficiently use charged electric energy to prolong an operation time of the mobile applications. One among various methods of reducing the power consumption helps parts to enter into a suspend mode based on a state of the applications.

In the case of a mobile application device such as a mobile phone, the parts for operations of corresponding applications consume the electric power during a normal operation mode. However, other parts are deactivated so the other parts no longer consume the electric power, except for a part for performing a mode transition during the suspend mode.

It is preferred that an operating current used for transmission/reception of the current mode bus interface system has a small magnitude. Additionally, according to an application, a capacitance component of a printed circuit board (PCB) used for transmission/reception of the current mode bus interface system may be increased.

Consequently, in the mode transition of the bus interface system, when the mode transition is performed with the operating current, a time period required for performing the mode transition may be delayed.

SUMMARY OF THE INVENTION

One embodiment of the present invention provides a current drive circuit capable of driving currents so a voltage level of a drive node rapidly reaches a voltage level of a reference voltage.

Another embodiment of the present invention provides a method of boosting a current, capable of driving currents so a voltage level of a drive node is rapidly boosted to an operating point.

In one embodiment of the present invention, a current drive circuit includes a differential voltage detector configured to detect a voltage level of a drive node and configured to compare the voltage level of the drive node with a voltage level of a reference voltage to generate a comparison signal, a control logic circuit configured to generate a control signal to provide a current to the drive node based on the comparison signal, and a current driver configured to provide the current to the drive node or provide the current from the drive node based on the control signal.

The current drive circuit may provide a current so the voltage level of the drive node becomes equal to an operating point during a mode transition of a current mode bus interface system. The operating point may be a bias point of transistors used for implementing the host or the client of the current mode bus interface system. The current drive circuit may drive a current having a magnitude relatively larger than that of an operating current such as a reference current, a clock current or a data current in the current mode bus interface system.

The control logic circuit may generate the control signal as long as the control logic circuit is not reset to provide the current to the drive node one time.

In another embodiment of the present invention, a method of boosting a current includes detecting a voltage level of a drive node, comparing the voltage level of the drive node with a voltage level of a reference voltage, generating a comparison signal, generating a control signal to provide a current to the drive node based on the comparison signal, and providing a current so the voltage level of the drive node becomes equal to an operating point, to the drive node or providing the current from the drive node based on the control signal.

The method of boosting the current may enable a voltage level of a predetermined drive node to reach a predetermined voltage level required so a circuit constituting the current mode bus interface system normally operates by providing a relatively large current compared with an operating current such as a reference current for a short time during the mode transition of the current mode bus interface system.

The method of boosting the current may be used when a current mode bus interface system performs a mode transition.

The step of generating a control signal may include generating the control signal as long as a reset operation is not performed, to provide the current to the drive node one time.

The method of boosting the current may be used when the current mode bus interface system performs the mode transition from a suspend mode to a normal operation mode. The method of boosting the current may be used for driving a reference current, a clock current and a data current of a host device of the current mode bus interface system. The method of boosting the current may drive a current having a magnitude relatively larger than that of an operating current such as a reference current, a clock current or a data current in the current mode bus interface system.

BRIEF DESCRIPTION OF THE DRAWINGS

The above and other features of the present invention will become more apparent when described in detailed exemplary embodiments thereof with reference to the attached drawings in which.

DETAILED DESCRIPTION OF PREFERRED EMBODIMENTS

Detailed illustrative embodiments of the present invention are disclosed herein. However, specific structural and functional details disclosed herein are merely representative for purposes of describing exemplary embodiments of the present invention. This invention may, however, be embodied in many alternate forms and should not be construed as limited to the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Figure 1:
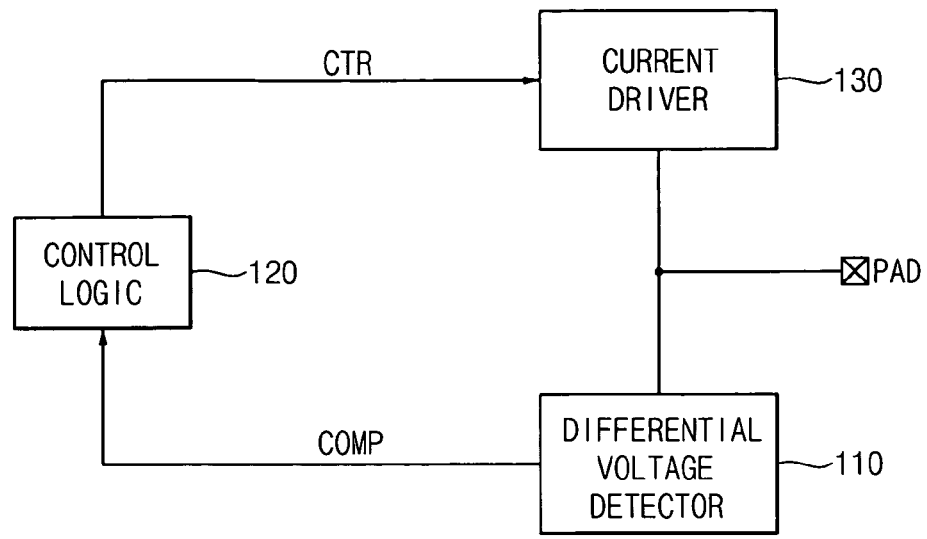
FIG. 1 is a block diagram illustrating a current drive circuit according to an exemplary embodiment of the present invention.

FIG. 1 is a block diagram illustrating a current drive circuit according to an exemplary embodiment of the present invention. Referring to FIG. 1, the current drive circuit includes a differential voltage detector 110, a control logic circuit 120 and a current driver 130.

The differential voltage detector 110 detects a voltage level of a drive node PAD and compares the voltage level of the drive node PAD with a reference voltage to generate a comparison signal COMP.

For example, the comparison signal COMP may be a signal composed of about 2 bits and the differential voltage detector 110 may activate a first bit of the comparison signal COMP when the voltage level of the drive node PAD is lower than that of the reference voltage. Also, the differential voltage detector 110 may activate a second bit of the comparison signal COMP when the voltage level of the drive node PAD is higher than that of the reference voltage and the differential voltage detector 110 may deactivate the 2 bits of the comparison signal COMP when a voltage difference between the voltage level of the drive node PAD and that of the reference voltage is less than a predetermined voltage level.

The control logic circuit 120 generates a control signal CTR to provide a current to the drive node PAD based on the comparison signal COMP.

For example, the control signal CTR may be a signal composed of about 2 bits. Also, the control logic circuit 120 may activate a first bit of the control signal CTR to provide a current to the drive node PAD or the control logic circuit 120 may activate a second bit of the control signal CTR to provide the current from the drive node PAD.

The current driver 130 provides the current to the drive node PAD or provides the current from the drive node PAD based on the control signal CTR.

For example, the current driver 130 may provide a current to the drive node PAD when the first bit of the control signal CTR is activated or the current driver 130 may provide the current from the drive node PAD when the second bit of the control signal CTR is activated.

Additionally, the current driver 130 may drive a current having a magnitude relatively larger than that of an operating current such as a reference current, a clock current or a data current in a current mode bus interface system.

Driving the current is desired so the voltage level of the drive node PAD may rapidly reach that of the operating point by having a current magnitude relatively larger than that of the operating current during the mode transition of the current mode bus interface system.

The current drive circuit shown in FIG. 1 may be used when the current mode bus interface system performs the mode transition from the suspend mode to the normal operation mode, and the current drive circuit may provide the current to the drive node PAD one time to not affect the normal operation mode of the bus interface system.

Figure 2:
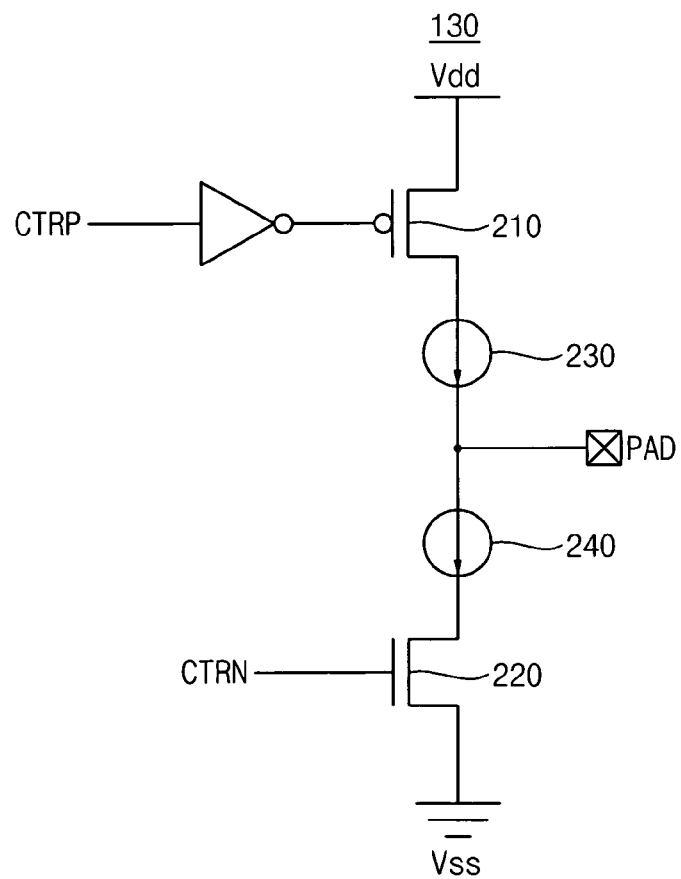
FIG. 2 is a circuit diagram illustrating a current driver shown in FIG. 1 according to an exemplary embodiment of the present invention.

FIG. 2 is a circuit diagram illustrating a current driver 130 shown in FIG. 1 according to an exemplary embodiment of the present invention.

The current driver 130 is operated based on two control signals CTRP and CTRN that are composed of 1 bit, respectively.

Referring to FIG. 2, the current driver 130 includes a pMOS transistor 210, a nMOS transistor 220 and current sources 230 and 240.

The pMOS transistor 210 provides a current path between the power voltage Vdd and the drive node PAD based on one bit of the control signal CTRP. That is, the pMOS transistor 210 functions as a switch between the power voltage Vdd and the current source 230 when an inverted signal of the control signal CTRP that is composed of one bit is applied to a gate of the pMOS transistor 210.

The nMOS transistor 220 provides a current path between ground Vss and the drive node PAD based on the control signal CTRN. That is, the nMOS transistor 220 functions as a switch between ground Vss and the current source 240 when the control signal CTRN that is composed of one bit is applied to a gate of the nMOS transistor 220.

The current source 230 is coupled between the power voltage Vdd and the drive node PAD, and provides a current to the drive node PAD.

The current source 240 is coupled between ground Vss and the drive node PAD, and provides the current from the drive node PAD.

The current sources 230 and 240 may drive a current having a magnitude relatively larger than that of the operating current such as the reference current, the clock current or the data current, and may be implemented using a CMOS current mirror.

Figure 3:
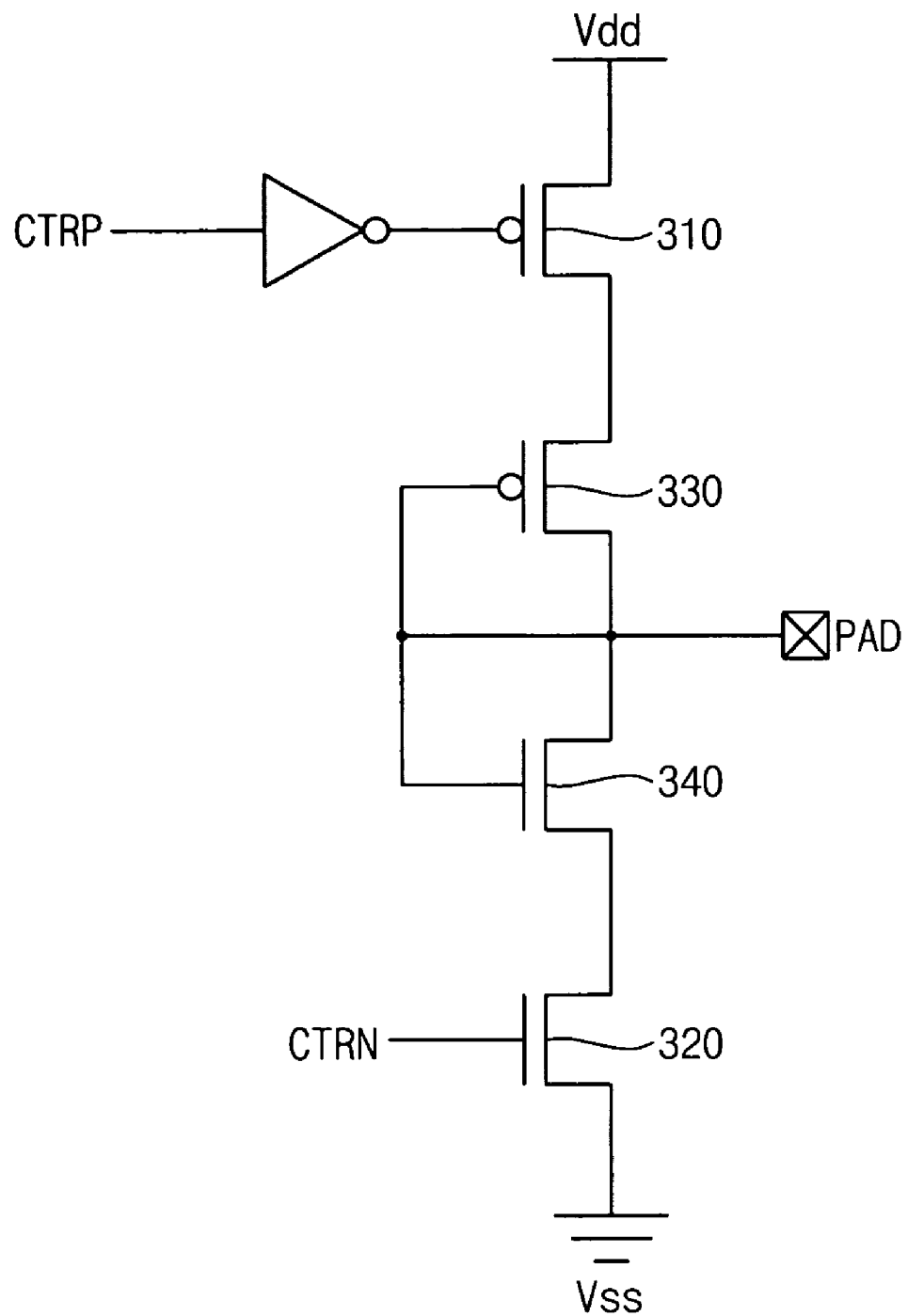
FIG. 3 is a circuit diagram illustrating a current driver shown in FIG. 1 according to another exemplary embodiment of the present invention.

FIG. 3 is a circuit diagram illustrating a current driver 130 shown in FIG. 1 according to another exemplary embodiment of the present invention.

The current driver 130 is performed based on two control signals CTRP and CTRN that are composed of 1 bit, respectively.

Referring to FIG. 3, the current driver 130 includes pMOS transistors 310 and 330, and nMOS transistors 320 and 340.

The pMOS transistor 310 provides a current path between the power voltage Vdd and the drive node PAD based on the control signal CTRP that is composed of 1 bit. That is, the pMOS transistor 310 functions as a switch between the power voltage Vdd and the pMOS transistor 330 when an inverted signal of the control signal CTRP that is composed of 1 bit is applied to a gate of the pMOS transistor 310.

The nMOS transistor 320 provides a current path between ground Vss and the drive node PAD based on the control signal CTRN that is composed of 1 bit. That is, the nMOS transistor 320 functions as a switch between ground Vss and the nMOS transistor 340 when the control signal CTRN that is composed of 1 bit is applied to a gate of the nMOS transistor 320.

The pMOS transistor 330 is diode coupled, and is coupled between the power voltage Vdd and the drive node PAD to provide the current to the drive node PAD.

The nMOS transistor 340 is diode coupled, and is coupled between ground Vss and the drive node PAD to provide the current from the drive node PAD.

The pMOS transistor 330 and the nMOS transistor 340 may provide a larger current when a voltage difference between the drive node PAD and the reference voltage becomes larger; thus, the current driver 130 may effectively drive the current.

Figure 4:
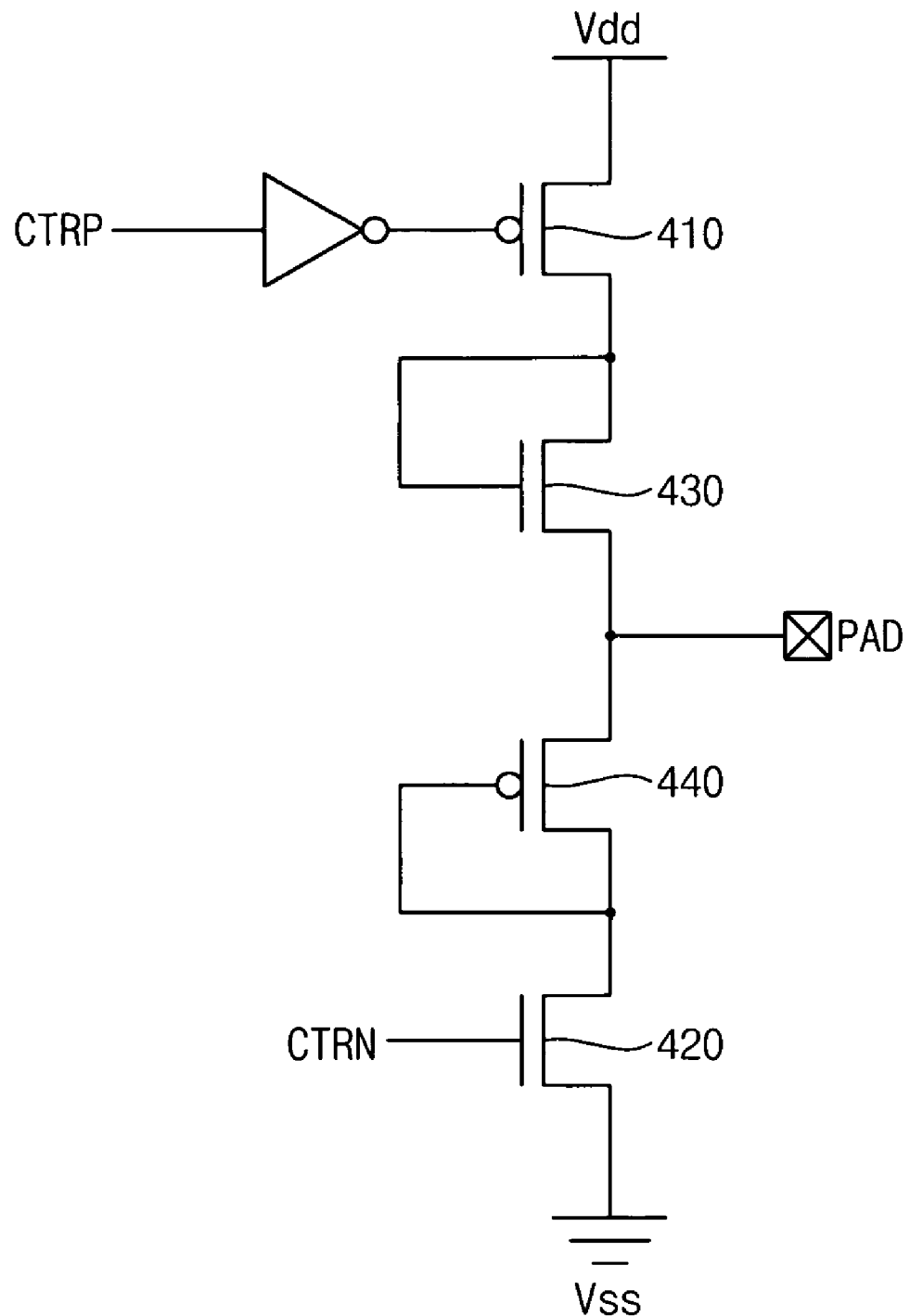
FIG. 4 is a circuit diagram illustrating a current driver shown in FIG. 1 according to another exemplary embodiment of the present invention.

FIG. 4 is a circuit diagram illustrating a current driver 130 shown in FIG. 1 according to another exemplary embodiment of the present invention.

The current driver 130 is performed based on two control signals CTRP and CTRN that are composed of 1 bit, respectively.

Referring to FIG. 4, the current driver 130 includes pMOS transistors 410 and 440, and nMOS transistors 420 and 430.

The pMOS transistor 410 provides a current path between the power voltage Vdd and the drive node PAD based on the control signal CTRP that is composed of 1 bit. That is, the pMOS transistor 410 functions as a switch between the power voltage Vdd and the MOS transistor 430 when an inverted signal of the control signal CTRP that is composed of 1 bit is applied to a gate of the pMOS transistor 410.

The nMOS transistor 420 provides a current path between ground Vss and the drive node PAD based on the control signal CTRN that is composed of 1 bit. That is, the nMOS transistor 420 functions as a switch between ground Vss and the pMOS transistor 440 when the control signal CTRN that is composed of 1 bit is applied to a gate of the nMOS transistor 420.

The nMOS transistor 430 is diode coupled, and is coupled between the power voltage Vdd and the drive node PAD to provide the current to the drive node PAD.

The pMOS transistor 440 is diode coupled, and is coupled between ground Vss and the drive node PAD to provide the current from the drive node PAD.

The nMOS transistor 430 and the pMOS transistor 440 may provide a larger current when a voltage difference between the drive node PAD and the reference voltage becomes larger; thus, the current driver 130 may effectively drive the current.

It is preferred that the control signals CTRP and CTRN applied to the current drivers 130 shown in FIGS. 2 through 4 not be simultaneously activated. Further, it is preferred that the control signals CTRP and CTRN not be activated again as long as the current drive circuit has not been reset, which is after the current has been driven according to the activation of one of the control signals CTRP and CTRN, the voltage difference between the reference voltage and the drive node PAD has become smaller, and the control signals CTRP and CTRN have been deactivated. It is preferred that the control signals CTRP and CTRN not be activated because abnormal operations due to undesired current drive may be reduced when the current mode bus interface system performs in the normal operation mode.

Figure 5:
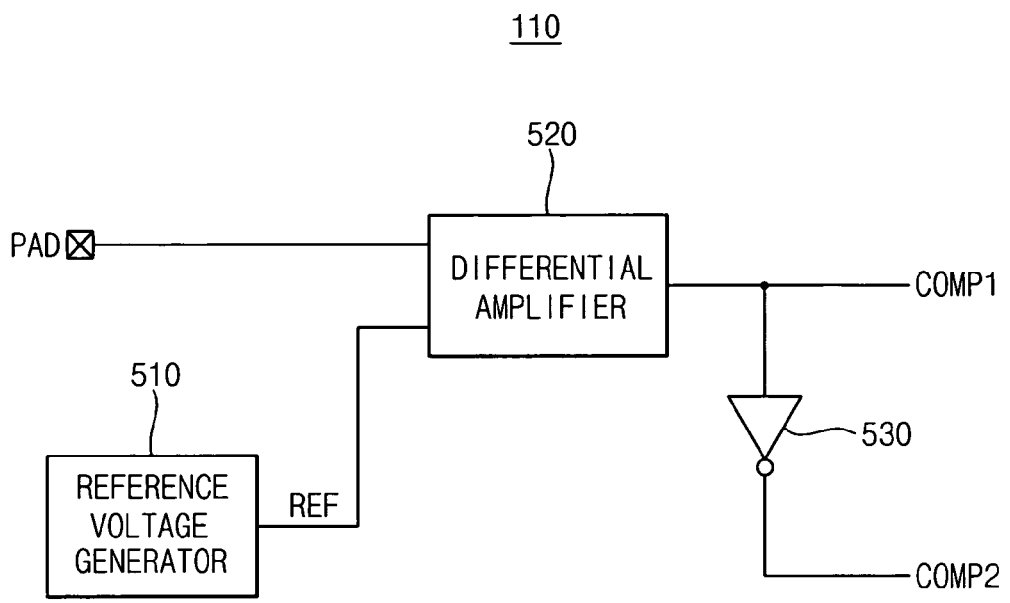
FIG. 5 is a block diagram illustrating a differential voltage detector shown in FIG. 1 according to an exemplary embodiment of the present invention.

FIG. 5 is a block diagram illustrating a differential voltage detector 110 shown in FIG. 1 according to an exemplary embodiment of the present invention.

The differential voltage detector 110 shown in FIG. 5 generates comparison signals COMP1 and COMP2 that are each composed of 1 bit.

Referring to FIG. 5, the differential voltage detector 110 includes a reference voltage generator 510, a differential amplifier 520 and an inverter 530.

The reference voltage generator 510 generates a reference voltage. The reference voltage generator 510 may provide the reference voltage REF. The reference voltage REF corresponds to a voltage of a node, through which an identical current with a magnitude of a reference current of a current mode bus interface system flows.

The reference voltage generator 510 may be implemented using various methods such as a band-gap technique known to one of ordinary skill in the art.

The differential amplifier 520 amplifies a voltage difference between the drive node PAD and the reference voltage REF to generate the comparison signal COMP1. The differential amplifier 520 may include a single-ended operational amplifier.

The inverter 530 inverts the comparison signal COMP1 to generate the other comparison signal COMP2. Accordingly, two comparison signals COMP1 and COMP2 are not simultaneously activated. For example, the differential voltage detector 110 may activate the comparison signal COMP1 to provide a current to the drive node PAD when the voltage level of the drive node PAD is lower than that of the reference voltage REF. Alternatively, the differential voltage detector 110 may activate the comparison signal COMP2 to provide the current from the drive node PAD when the voltage level of the drive node PAD is higher than that of the reference voltage REF.

Figure 6:
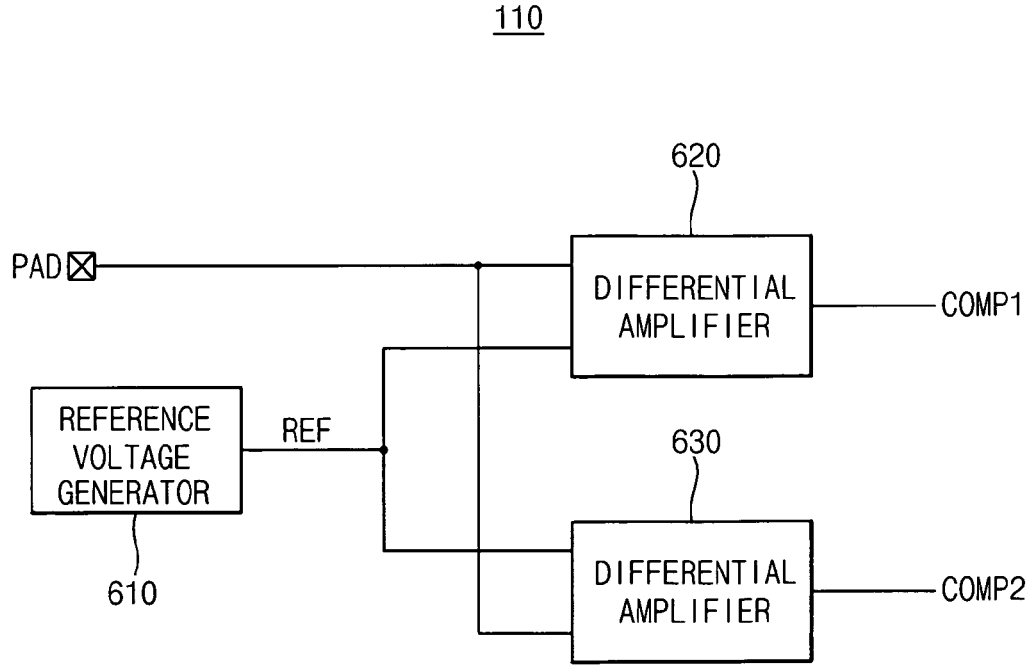
FIG. 6 is a block diagram illustrating a differential voltage detector shown in FIG. 1 according to another exemplary embodiment of the present invention.

FIG. 6 is a block diagram illustrating a differential voltage detector 110 shown in FIG. 1 according to another exemplary embodiment of the present invention.

The differential voltage detector 110 shown in FIG. 6 generates comparison signals COMP1 and COMP2 that are each composed of 1 bit.

Referring to FIG. 6, the differential voltage detector 110 includes a reference voltage generator 610 and differential amplifiers 620 and 630.

The reference voltage generator 610 generates a reference voltage REF. The reference voltage REF corresponds to a voltage of a node, through which an identical current with a magnitude of a reference current of a current mode bus interface system flows.

The reference voltage generator 610 may be implemented using various methods such as a band-gap technique known to one of ordinary skill in the art.

The differential amplifier 620 amplifies a voltage difference between the drive node PAD and the reference voltage REF to generate the comparison signal COMP1.

The differential amplifier 630 amplifies a voltage difference between the drive node PAD and the reference voltage REF to generate the comparison signal COMP2.

For example, when the differential amplifier 620 amplifies a voltage value resulting from subtracting a voltage value of the drive node PAD from a voltage value of the reference voltage REF, the differential amplifier 630 amplifies a voltage value resulting from subtracting a voltage value of the reference voltage REF from a voltage value of the drive node PAD.

The differential amplifiers 620 and 630 may include a single-ended operational amplifier.

Unlike the differential voltage detector 110 shown in FIG. 5, the differential voltage detector 110 shown in FIG. 6 includes two differential amplifiers 620 and 630.

Accordingly, the differential voltage detector 110 shown in FIG. 6 may simultaneously deactivate the two comparison signals COMP1 and COMP2.

For example, when the voltage difference between the drive node PAD and the reference voltage REF is less than a predetermined voltage level, both of the two comparison signals COMP1 and COMP2 may be deactivated.

However, like the differential voltage detector 110 shown in FIG. 5, it is preferred that the two comparison signals not be simultaneously activated.

For example, the differential voltage detector 110 may activate the comparison signal COMP1 to provide the current to the drive node PAD when the voltage level of the drive node PAD is lower than that of the reference voltage REF. Alternatively, the differential voltage detector 110 may activate the comparison signal COMP2 to provide the current from the drive node PAD when the voltage level of the drive node PAD is higher than that of the reference voltage REF.

Figure 7:
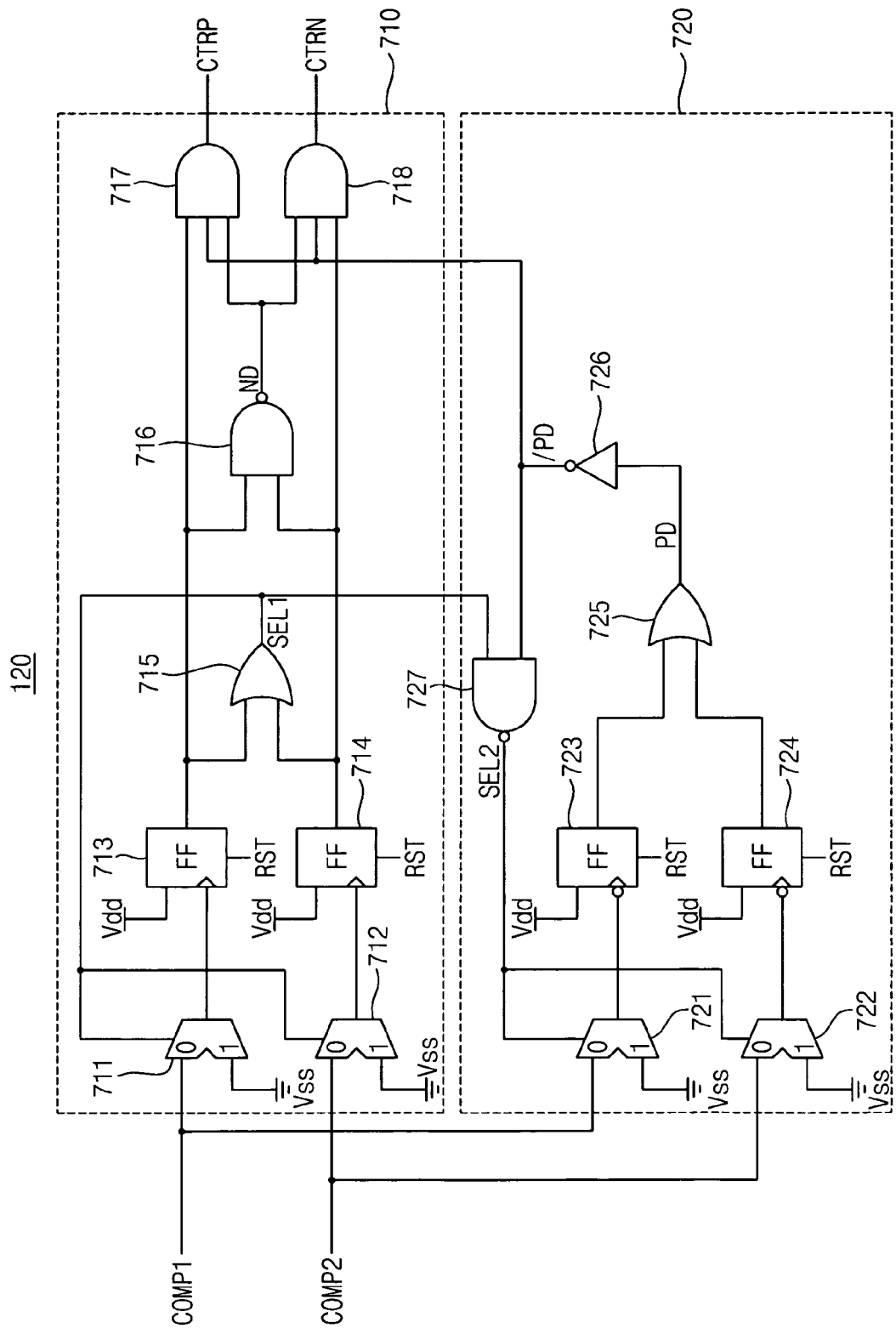
FIG. 7 is a circuit diagram illustrating a control logic circuit shown in FIG. 1 according to an exemplary embodiment of the present invention.

FIG. 7 is a circuit diagram illustrating a control logic circuit 120 shown in FIG. 1 according to an exemplary embodiment of the present invention.

The control logic circuit 120 generates two control signals CTRP and CTRN based on two comparison signals COMP1 and COMP2.

Referring to FIG. 7, the control logic circuit 120 includes a control signal generator 710 and a control signal reset circuit 720.

The control signal generator 710 activates the control signals using a state transition of the comparison signals. That is, the control signal generator 710 activates the control signal CTRP to a logic 'high' (i.e., a high power voltage Vdd) state when a state of the comparison signal COMP1 is changed to logic 'high' from logic 'low' (i.e., a ground voltage Vss), and the control signal generator 710 activates the control signal CTRN to the logic 'high' state when the state of the comparison signal COMP2 is changed to logic 'high' from logic 'low'.

After the control signal is activated, the control signal reset circuit 720 deactivates the control signals using the state transition of the comparison signals. That is, the control signal reset circuit 720 detects that the state of the comparison signal COMP1 or COMP2 is changed to logic 'low' from logic 'high' when the control signal CTRP and/or CTRN are/is at the logic 'high' state, and then, deactivates both of the control signals CTRP and CTRN to the logic 'low' state.

Accordingly, the control logic circuit 120 activates the control signals only one time as long as the control logic circuit 120 is not reset.

The control signal generator 710 includes a first multiplexer (MUX) 711, a second MUX 712, a first flip-flop 713, a second flip-flop 714, an OR gate 715, a NAND gate 716, a first AND gate 717 and a second AND gate 718.

The first MUX 711 selects one of the comparison signal COMP1 and a logic 'low' based on a first selection signal SEL1. That is, the first MUX 711 selects the comparison signal COMP1 when the first selection signal SEL1 has a logic 'low' state, and the first MUX 711 selects logic 'low' when the first selection signal SEL1 has a logic 'high' state.

The second MUX 712 selects one of the comparison signal COMP2 and a logic 'low' signal based on a second selection signal SEL2. That is, the second MUX 712 selects the comparison signal COMP2 when the first selection signal SEL1 has logic 'low' state, and the first MUX 711 selects logic 'low' when the first selection signal SEL1 has a logic 'high' state.

The first flip-flop 713 samples the logic 'high' in response to a rising edge of an output signal of the first MUX 711.

That is, the first flip-flop 713 changes the state of its output signal to the logic 'high' state when the state of the output signal of the first MUX 711 is changed to logic 'high' from logic 'low'.

The second flip-flop 714 samples the logic 'high' in response to the rising edge of an output signal of the second MUX 712.

That is, the second flip-flop 714 changes the state of its output signal to the logic 'high' state when the state of the output signal of the second MUX 712 is changed to logic 'high' from logic 'low'.

The OR gate 715 performs a logical OR operation on the output signal of the first flip-flop 713 and the output signal of the second flip-flop 714 to generate the first selection signal SEL1.

The NAND gate 716 performs a logical NAND operation on the output signal of the first flip-flop 713 and the output signal of the second flip-flop 714 to generate a NAND signal ND.

The first AND gate 717 performs a logical AND operation on the output signal of the first flip-flop 713, the NAND signal ND and an activation signal/PD to generate the control signal CTRP.

The second AND gate 718 performs the logical AND operation on the output signal of the second flip-flop 714, the NAND signal ND and the activation signal/PD to generate the control signal CTRN.

The control signal reset circuit 720 includes a third MUX, a fourth MUX, a third flip-flop 723, a second flip-flop 724, an OR gate 725, a NAND gate 727 and an inverter 726.

The third MUX 721 selects one of the comparison signal COMP1 and logic 'low' based on the second selection signal SEL2. That is, the third MUX 711 selects the comparison signal COMP1 when the state of the second selection signal SEL2 is logic 'low', and selects logic 'low' when the state of the second selection signal SEL2 is a logic 'high'.

The fourth MUX 722 selects one of the comparison signal COMP2 and logic 'low' based on the second selection signal SEL2.

That is, the fourth MUX 722 selects the comparison signal COMP2 when the state of the second selection signal SEL2 has a logic 'low', and selects logic 'low' when the state of the second selection signal SEL2 is a logic 'high'.

The third flip-flop 723 samples the logic 'high' in response to a falling edge of an output signal of the third MUX 721.

That is, the third flip-flop 723 changes the state of its output signal to the logic 'high' state when the state of the output signal of the third MUX 721 is changed to logic 'low' from logic 'high'.

The fourth flip-flop 724 samples the logic 'high' in response to the falling edge of an output signal of the fourth MUX 722.

That is, the fourth flip-flop 724 changes the state of its output signal to the logic 'high' state when the state of the output signal of the fourth MUX 722 is changed to logic 'low' from logic 'high'.

The OR gate 725 performs the logical OR operation on the output signal of the third flip-flop 723 and the output signal of the fourth flip-flop 724 to generate a deactivation signal PD.

The inverter 726 inverts the deactivation signal PD to generate the activation signal/PD.

The NAND gate 727 performs the logical NAND operation on the activation signal/PD and the first selection signal SEL1 to generate the second selection signal SEL2.

Hereinafter, operations of the control logic circuit 120 shown in FIG. 7 will be explained in detail.

During the reset state, all of the flip-flops 713, 714, 723 and 724 output logic 'low'. Accordingly, the state of the first selection signal SEL1 and the deactivation signal PD is changed to logic 'low'.

The state of the second selection signal SEL2 becomes logic 'high' since the second selection signal SEL2 is resulted from performing the logical NAND operation on the activation signal/PD having logic 'high' and the first selection signal SEL 1 having logic 'low'.

Here, the NAND signal ND has a logic 'high' state, and both the control signals CTRP and the CTRN have logic 'low'.

The first MUX 711 selects the comparison signal COMP1, and the second MUX 712 selects the comparison signal COMP2 since the first selection signal SEL 1 has a logic 'low' state during the reset state.

The third MUX 721 and the fourth MUX 722 select logic 'low' since the second selection signal SEL2 has a logic 'high' state during the reset state.

Because the first MUX 711 selects the comparison signal COMP1 and the second MUX 712 selects the comparison signal COMP2 during the reset state, when the state of the comparison signal COMP1 or the comparison signal COMP2 is changed to logic 'high' from logic 'low', one of the flip-flops 713 and 714 outputs the output signal having the logic 'high' state.

When one output signal of the flop-flops 713 and 714 becomes the logic 'high' state, the first selection signal SEL1 becomes the logic 'high' state and the state of the NAND signal ND is maintained at logic 'high'.

Here, because the first selection signal SEL1 has a logic 'high' state, both the first MUX 711 and the second MUX 712 select logic 'low'. Accordingly, the states of the output signals of the flip-flops 713 and 714 are not changed.

When both of the output signals of the flip-flops 713 and 714 become the logic 'high' state, the state of the NAND signal ND becomes the logic 'low' state to change both states of the two control signals CTRP and CTRN to the logic 'low' state.

When the state of the output signal of the first flip-flop 713 is at logic 'high', and the state of the output signal of the second flip-flop 714 is at logic 'low', the state of the control signal CTRP becomes logic 'high', and the control signal CTRN becomes logic 'low'.

When the state of the control signal CTRP becomes logic 'high', the current driver 130 shown in FIGS. 2 through 4 provides the current to the drive node PAD.

When the state of the output signal of the second flip-flop 714 is at logic 'high', and the state of the output signal of the first flip-flop 713 is at logic 'low', the state of the control signal CTRP becomes logic 'low', and the state of the control signal CTRN becomes logic 'high'.

When the state of the control signal CTRN becomes logic 'high', the current driver 130 shown in FIGS. 2 through 4 supplies the current from the drive node PAD.

While the state of the activation signal/PD is at logic 'high', the state of the first selection signal SEL1 becomes logic 'high', the state of the second selection signal SEL2 becomes logic 'low' since all of the inputs to the NAND gate 727 become logic 'high'.

Accordingly, the third MUX 721 selects the comparison signal COMP1, and the fourth MUX 722 selects the comparison signal COMP2. At this time, when one of the comparison signals COMP1 and COMP2 having the logic 'high' state is changed to the logic 'low' state, one of the output signals of the flip-flops 723 and 724 is changed to the logic 'high' state from the logic 'low' state.

As a result, the state of the deactivation signal PD becomes logic 'high', and the state of the activation signal/PD becomes logic 'low'.

When the activation signal/PD becomes the logic 'low' state, the second selection signal SEL2 becomes the logic 'high' state.

Accordingly, both the third MUX 721 and the fourth MUX 722 select logic 'low', and then, both of the output signals of the third flip-flop 723 and the fourth flip-flop 724 are not changed.

Additionally, when the activation signal/PD is deactivated to the logic 'low' state, the NAND gates 717 and 718 output the control signals CTRP and CTRN having the logic 'low' state, respectively.

Because the state of the activation signal is continuously maintained at logic 'low' after the state of the activation signal/PD is changed to logic 'low', the two control signals CTRP and CTRN are continuously maintained at logic 'low' as long as the control logic circuit 120 is not reset.

In the case where the voltage level of the drive node PAD is lower than that of the reference voltage REF, the control logic circuit 120 shown in FIG. 7 detects that the state of the comparison signal COMP1 is changed to logic 'high' from logic 'low', and then, changes the state of the control signal CTRP to logic 'high' from logic 'low' to provide the current to the drive node PAD.

When the current is provided to the drive node PAD, and then, the voltage level of the drive node PAD reaches the voltage level of the reference voltage REF, the state of the comparison signal COMP1 is changed to logic 'low' from logic 'high', and the control signal reset circuit 720 of the control logic circuit 120 detects the state transition of the comparison signal COMP1 to change the state of the control signal CTRP to logic 'low' from logic 'high', thereby stopping the supply of current to the drive node PAD.

In case where the voltage level of the drive node PAD is higher than that of the reference voltage REF, when the control logic circuit 120 shown in FIG. 7 detects that the state of the comparison signal COMP2 is changed to logic 'high' from logic 'low', the control logic circuit 120 changes the state of the control signal CTRN to logic 'high' from logic 'low' to supply the current from the drive node PAD.

When the current flows from the drive node PAD, and then, the voltage level of the drive node PAD approaches the voltage level of the reference voltage REF, the state of the comparison signal COMP2 is changed to logic 'low' from logic 'high'.

The control signal reset circuit 720 of the control logic circuit 120 detects the state transition of the comparison signal COMP2, and changes the state of the control signal CTRN to logic 'low' from logic 'high', thereby stopping the supply of the current from the drive node PAD.

Figure 8:
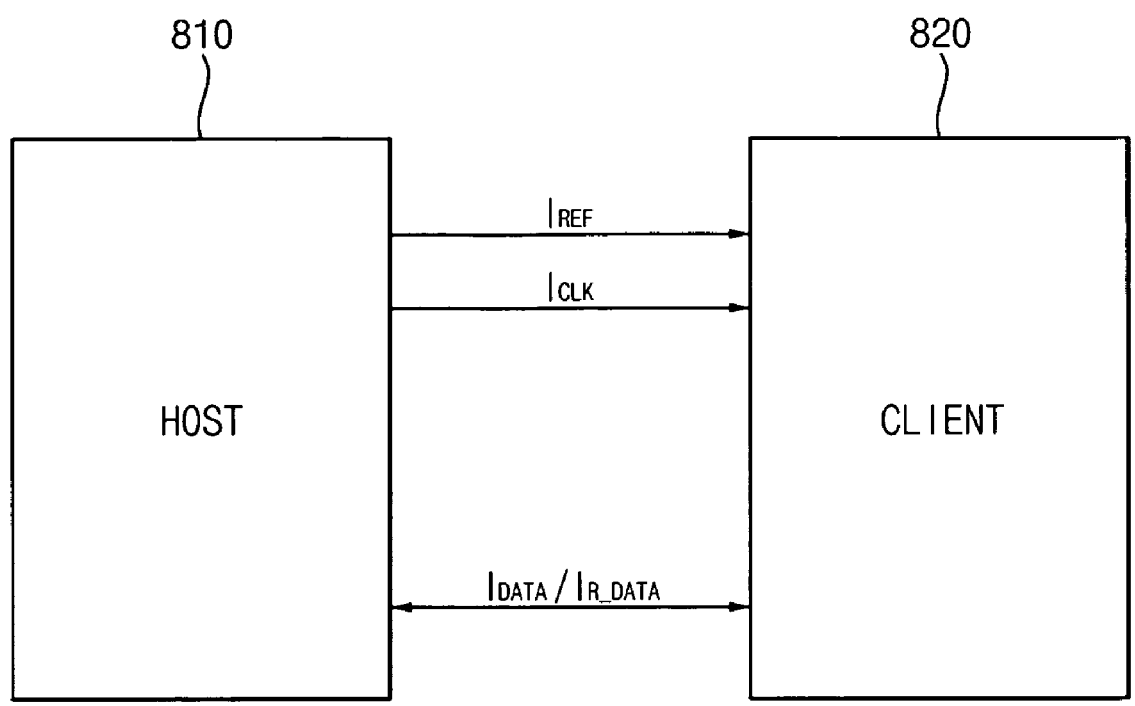
FIG. 8 is a block diagram illustrating a current mode bus interface system according to an exemplary embodiment of the present invention.

FIG. 8 is a block diagram illustrating a current mode bus interface system according to an exemplary embodiment of the present invention.

Referring to FIG. 8, the current mode bus interface system includes a current mode host interface device 810 and a current mode client interface device 820.

The current mode host interface device 810 transmits a reference current IREF and a clock current ICLK, transmits a data current IDATA during a forward direction transfer mode, and receives a reverse direction data current IR_DATA during a reverse direction transfer mode.

The current mode host interface device 810 compares the reverse direction data current IR_DATA with the reference current IREF to generate a reverse direction data voltage.

The current mode client interface device 820 receives the reference current IREF and the clock current ICLK, and compares the reference current IREF with the clock current ICLK to generate a clock voltage.

The current mode client interface device 820 receives the data current IDATA during the forward direction transfer mode to compare the data current IDATA with the received reference current IREF to generate a data voltage, and the transmits the reverse direction data current IR_DATA during the reverse direction transfer mode through a wire where the data current IDATA is received.

For example, the clock current ICLK, the data current IDATA and the reverse direction data current IR_DATA having a current level of about 300 µA may be set to a logic 'low' level. The clock current ICLK, the data current IDATA and the reverse direction data current IR_DATA having a current level of about 300 µA may be set to a logic 'high' level. At the same time, the reference current IREF may have a current level of about 200 µA.

The reverse direction data current IR_DATA may have a frequency lower than that of the data current IDATA since generally, data transfer quantity from the client to the host is smaller than that from the host to the client.

Figure 9:
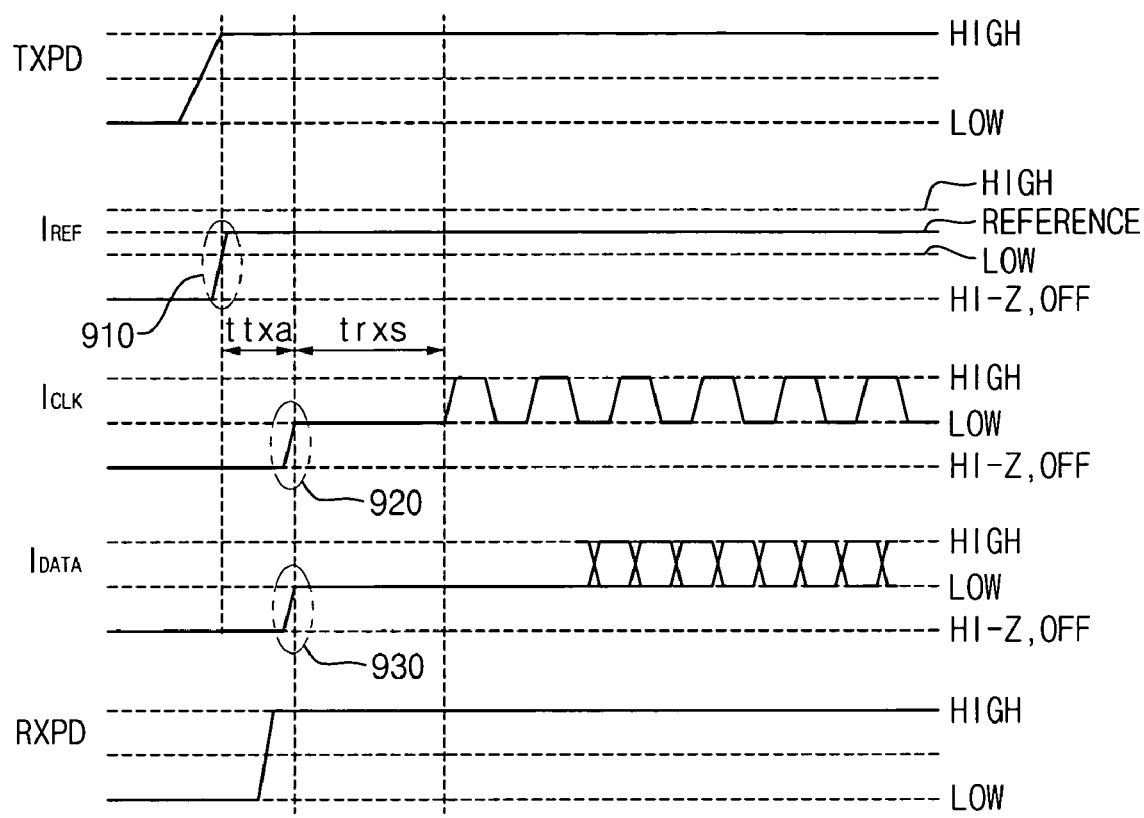
FIGS. 9 through 11 are timing diagrams for methods of boosting a current according to exemplary embodiments of the present invention.
Figure 10:
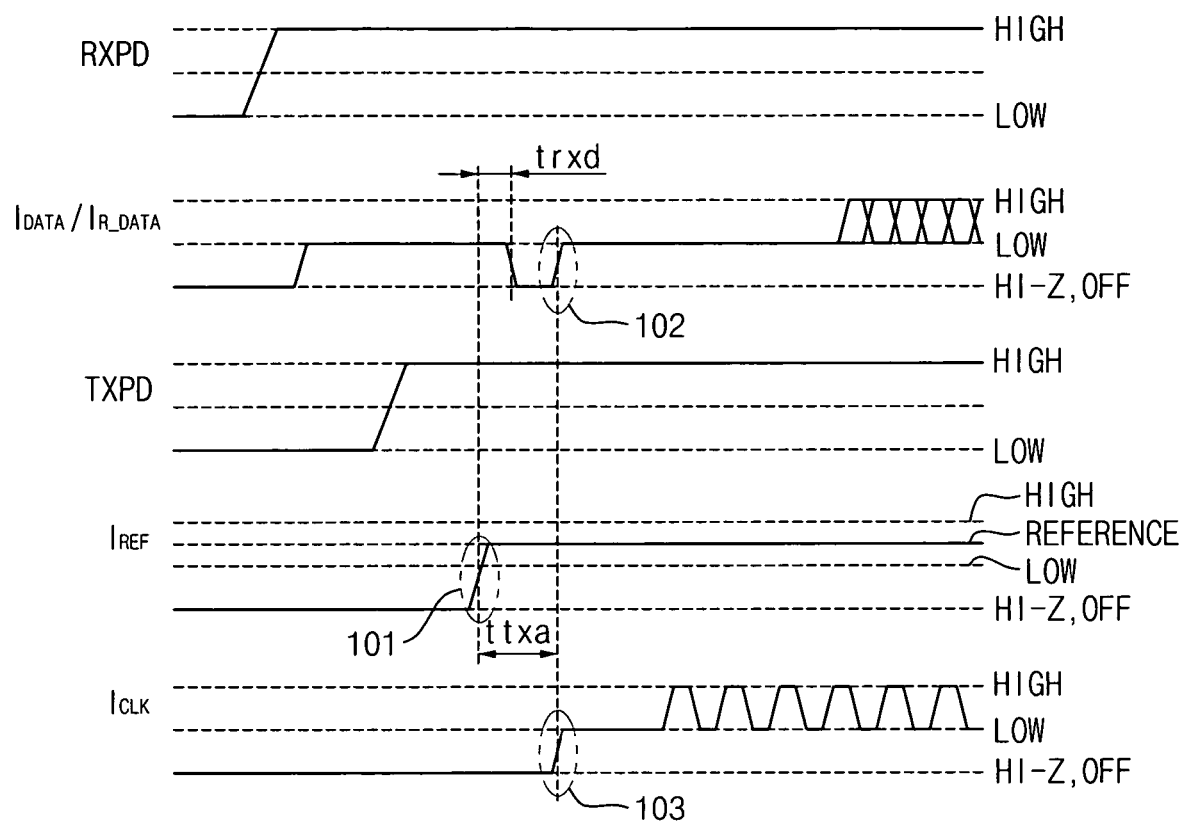
Figure 11:
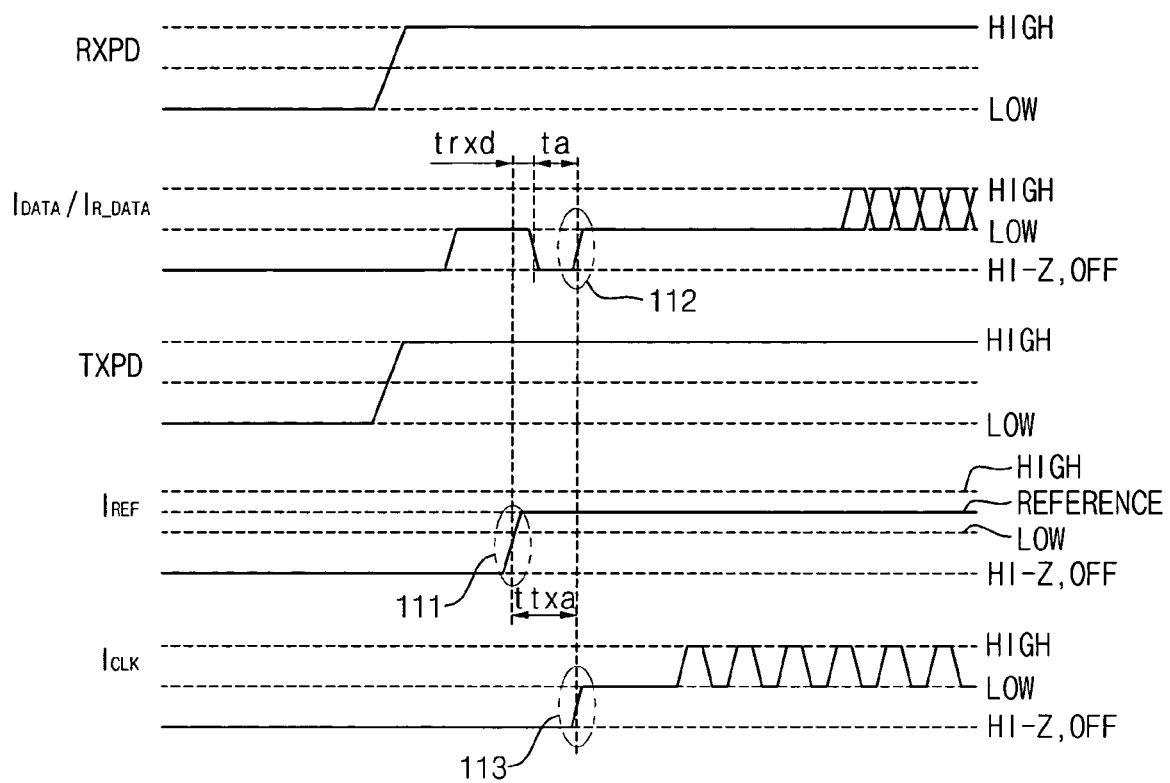

FIGS. 9 through 11 are timing diagrams for methods of boosting a current according to exemplary embodiments of the present invention.

Hereinafter, a current mode host interface device 810 and a current mode client interface device 820 may be referred to as a host 810 and a client 820, respectively.

The timing diagrams of control signals TXPD and RXPD represent a voltage level, respectively and the timing diagrams of the reference current IREF, the clock current ICLK, the data current IDATA and the reverse direction data current IR_DATA represent a current level, respectively.

FIG. 9 shows a mode transition to a normal operation mode of a current mode bus interface system in response to a wake-up request of a host.

Referring to FIG. 9, a host mode control signal TXPD is changed to the logic 'high' state from the logic 'low' state in response to the wake-up request of the host 810.

When the host mode control signal TXPD is changed to the logic 'high' state from the logic 'low' state, the host 810 supplies the reference current IREF, having been cut off, to the client 820.

Here, a voltage level of a node where the reference current IREF is transmitted may be rapidly boosted 910 to an operating point using the current drive circuit shown in FIG. 1. The operating point may be a bias point of transistors used for implementing the current mode bus interface system.

When the reference current IREF flows to the client 820, the client 820 detects the reference current IREF to change a state of the client mode control signal RXPD to logic 'high' from logic 'low'.

When the state of the client mode control signal RXPD is changed to logic 'high' from logic 'low', the client 820 activates internal modules having been in a sleep mode to perform the mode transition to the normal operation mode.

The host 810 transmits the clock current ICLK and the data current IDATA to the client 820 after the client 820 is ready to receive transmitted currents in the normal operation mode.

Here, a voltage level of a node where the clock current ICLK is transmitted and a voltage level of a node where the data current IDATA is transmitted may reach the operating point using the current drive circuit shown in FIG. 1. The operating point may be a bias point of transistors used for implementing the current mode bus interface system.

Within a time period 'ttxa' shown in FIG. 9, the state of the client mode control signal RXPD should be changed to logic 'high' from logic 'low'.

The time period 'ttxa' represents that from which the host 810 again supplies the reference current IREF, having been cut off, and that from which the host 810 again supplies the clock current ICLK and the data current IDATA.

The time period 'ttxa' is an important factor for accurate operations of the current mode bus interface system. At the timing of driving the reference current IREF, the clock current ICLK and the data current IDATA, the method of boosting the current using the current drive circuit shown in FIG. 1 may obtain the adequate time period 'ttxa' regardless of a capacitance of a printed circuit board (PCB).

From the point of time at which the host 810 supplies the clock current ICLK and the data current IDATA to the client 820, and after a time period 'trxs' elapses, each of the states or waveforms of the clock current ICLK and the data current IDATA is changed.

FIG. 10 shows a mode transition to a normal operation mode of a current mode bus interface system in response to a wake-up request of a client.

Referring to FIG. 10, the state of the client mode control signal RXPD is changed to logic 'high' from logic 'low' in response to the wake-up request of the client 820.

When the state of the client mode control signal RXPD is changed to logic 'high' from logic 'low', the client 820 supplies the reverse direction data current IR_DATA to the host 810. The state of the reverse direction data current IR_DATA may correspond to the logic 'low' level or may correspond to the logic 'high' level.

However, it is preferred that the current level of the reverse direction data current IR_DATA be detected by the host 810 using the reference current IREF.

When the reverse direction data current IR_DATA flows to the host 810, the host 810 detects the flow of the reverse direction data current IR_DATA to change the state of the host mode control signal TXPD from logic 'low' to logic 'high'.

When the state of the host mode control signal TXPD is changed to logic 'high' from logic 'low', the host 810 supplies the reference current IREF having been cut off to the client 820. At this time, the voltage level of the node where the reference current IREF may rapidly reach the operating point 101 using the current drive circuit shown in FIG. 1. The operating point may be a bias point of transistors used for implementing the current mode bus interface system.

When the reference current IREF flows to the client 820, the client 820 detects the flow of the reference current IREF and activates internal modules having been in the sleep mode to perform the mode transition to the normal operation mode.

Here, the client 820 stops transmitting the reverse direction data current IR_DATA to the host 810, and a transfer mode of a data transmitter/receiver (not shown) included in the client 820 is changed to a forward direction transfer mode.

The host 810 transmits the clock current ICLK and the data current IDATA to the client 820 after the client 820 is ready to receive transmitted currents in the forward direction transfer mode.

Here, the voltage level of the node where the clock current ICLK is transmitted 103 and the voltage level of the node where the data current IDATA is transmitted 102 may be rapidly boosted to the operating point using the current drive circuit shown in FIG. 1. The operating point may be a bias point of transistors used for implementing the current mode bus interface system.

Within a time period 'ttxa' shown in FIG. 10, the client 820 performs the transfer mode transition from the reverse direction transfer mode to the forward direction transfer mode.

The time period 'ttxa' represents that from which the host 810 supplies the reference current IREF to the client 820, again to which the host 820 supplies the clock current ICLK and the data current IDATA to the client 820, again. The time period 'ttxa' is a factor for accurate operations of the current mode bus interface system. At the time of driving the reference current IREF, the clock current ICLK and the data current IDATA, the method of boosting the current using the current drive circuit shown in FIG. 1 may obtain the adequate time period 'ttxa' regardless of a capacitance of a printed circuit board (PCB).

A time period 'trxd' represents that time from which the host 810 supplies the reference current IREF having been cut off to which the client 820 stops transmitting the reverse direction data current IR_DATA to the host 810.

FIG. 11 shows a mode transition to a normal operation mode of a current mode bus interface system when a host 810 and a client 820 nearly simultaneously generate a wake-up request.

Referring to FIG. 11, the state of the client mode control signal RXPD is changed to logic 'high' from logic 'low' in response to the wake-up request of the client 820, and nearly at the same time, the state of the host mode control signal TXPD is changed to logic 'high' from logic 'low' in response to the wake-up request of the host 810.

The host 810 supplies the reference current IREF having been cut off to the client 820 since the state of the host mode control signal is changed to logic 'high' from logic 'low'.

Here, the voltage level of the node where the reference current IREF is transmitted 111 may be rapidly boosted to the operating point using the current drive circuit shown in FIG. 1. The operating point may be a bias point of transistors used for implementing the current mode bus interface system.

The client 820 supplies the reverse direction data current IR_DATA to the host 810 since the state of the client mode control signal RXPD is changed to logic 'high' from logic 'low'.

After the host 810 supplies the reference current IREF to the client 820, the host 810 detects the reverse direction data current IR_DATA flowing from the client 820; however, the host 810 performs the transfer mode transition to the forward direction transfer mode since the host 810 already supplies the reference current IREF to the client 820.

After the client 820 supplies the reverse direction data current IR_DATA to the host 810, the client 820 detects the reference current IREF and activates the internal modules having been in the sleep mode to perform the mode transition to the normal operation mode.

Here, the client 820 stops transmitting the reverse direction data current IR_DATA to the host 810, and the transfer mode of the data transmitter/receiver (not shown) included in the client 820 is changed to the forward direction transfer mode.

The host 810 transmits the clock current ICLK and the data current IDATA after the client 820 is ready to receive the transmitted currents in the forward direction transfer mode.

Here, the voltage level of the node where the clock current ICLK is transmitted 113 and the voltage level of the node where the data current IDATA is transmitted 112 may be rapidly boosted to the operating point. The operating point may be a bias point of transistors used for implementing the current mode bus interface system.

Within a time period 'ttxa' shown in FIG. 11, the client 820 performs the transfer mode transition from the reverse direction transfer mode to the forward direction transfer mode.

The time period 'ttxa' represents that time from which the host 810 again supplies the reference current IREF to the client 820, and to which the host 810 again supplies the clock current ICLK and the data current IDATA to the client 820. The time period 'ttxa' is a factor for accurate operations of the current mode bus interface system. At the timing of driving the reference current IREF, the clock current ICLK and the data current IDATA, the method of boosting the current using the current drive circuit shown in FIG. 1 may obtain the adequate time period 'ttxa' regardless of a capacitance of a printed circuit board (PCB).

A time period 'trxd' represents that time from which the host 810 supplies the reference current IREF, having been cut off, to the client 820, to which the client 820 stops transmitting the reverse direction data current IR_DATA to the host 810.

A time period 'ta' represents that time from which the client 820 stops transmitting the reverse direction data current IR_DATA to the host 810, to which the host 810 again supplies the data current IDATA to the client 820.

It is preferred that the time period 'ttxa' be longer than sum of the time period 'trxd' and the time period 'ta'.

As described above, the current drive circuit and the method of boosting the current may drive a current so that the voltage level of the drive node is rapidly boosted to the reference voltage level. Accordingly, a time period consumed in which the transistors constituting the host or the client of the current mode bus interface system reach their operating point may be reduced.

Further, the current drive circuit and the method of boosting the current may help the current mode bus interface system to rapidly and precisely operate by reducing a time period consumed, in which the current mode bus interface system performs the mode transition from the suspend mode to the normal operation mode.

While exemplary embodiments of the present invention have been described in detail, it should be understood that various changes, substitutions and alterations may be made herein without departing from the scope of the invention.

What is claimed is:

1. A current drive circuit comprising:
a differential voltage detector configured to detect a voltage level of a drive node, configured to compare the voltage level of the drive node with a voltage level of a reference voltage to determine whether the voltage level of the drive node is smaller or larger than the voltage level of the reference voltage, and configured to generate a comparison signal according to a result of the determination;
a control logic circuit configured to generate a control signal to provide a current to the drive node based on the comparison signal; and
a current driver configured to provide the current for the drive node based on the control signal,
wherein the control logic circuit comprises:
a control signal generator configured to activate a first bit of the control signal using a state transition of a first bit of the comparison signal when a mode of a current mode bus interface system transitions from a suspend mode to a normal operation mode, and configured to activate a second bit of the control signal using a state transition of a second bit of the comparison signal when the mode of the current mode bus interface system transitions from the normal operation mode to the suspend mode; and
a control signal reset circuit configured to deactivate the first bit of the control signal using the state transition of the first bit of the comparison signal after the first bit of the control signal is activated, and configured to deactivate the second bit of the control signal using the state transition of the second bit of the comparison signal after the second bit of the control signal is activated.

2. The current drive circuit of claim 1, wherein the current driver provides the current until the voltage level of the drive node becomes equal to an operating point during a mode transition of the current mode bus interface system.

3. The current drive circuit of claim 2, wherein the control logic circuit generates the control signal until the control logic circuit is reset.

4. The current drive circuit of claim 1, wherein the differential voltage detector comprises:
a reference voltage generator configured to generate the reference voltage;
a differential amplifier configured to amplify a voltage difference between the voltage level of the drive node and the voltage level of the reference voltage to generate the first bit of the comparison signal; and
an inverter configured to invert the first bit of the comparison signal to generate the second bit of the comparison signal.

5. The current drive circuit of claim 1, wherein the differential voltage detector comprises:
a reference voltage generator configured to generate the reference voltage;
a first differential amplifier configured to amplify a voltage difference between the voltage level of the drive node and the voltage level of the reference voltage to generate the first bit of the comparison signal; and
a second differential amplifier configured to amplify a voltage difference between the voltage level of the drive node and the voltage level of the reference voltage to generate the second bit of the comparison signal.

6. The current drive circuit of claim 1, wherein the control signal generator comprises:
a first multiplexer (MUX) configured to select one of the first bit of the comparison signal and a first logic level based on a selection signal;
a second MUX configured to select one of the second bit of the comparison signal and the first logic level based on the selection signal;
a first flip-flop configured to sample a second logic level in response to a first logic level to second logic level transition of an output signal of the first MUX;
a second flip-flop configured to sample the second logic level in response to a first logic level to second logic level transition of an output signal of the second MUX;
an OR gate configured to perform a logical OR operation on an output signal of the first flip-flop and an output signal of the second flip-flop to generate the selection signal;
a NAND gate configured to perform a logical NAND operation on the output signal of the first flip-flop and the output signal of the second flip-flop to generate a NAND signal;
a first AND gate configured to perform a logical AND operation on the output signal of the first flip-flop, the NAND signal and an activation signal to generate the first bit of the control signal; and
a second AND gate configured to perform the logical AND operation on the output signal of the second flip-flop, the NAND signal and the activation signal to generate the second bit of the control signal.

7. The current drive circuit of claim 1, wherein the control signal reset circuit comprises:
a NAND gate configured to perform a logical NAND operation on the first selection signal and the activation signal to generate a selection signal;
a first multiplexer (MUX) configured to select one of the first bit of the comparison signal and a first logic level based on the selection signal;
a second MUX configured to select one of the second bit of the comparison signal and the first logic level based on the selection signal;
a first flip-flop configured to sample a second logic level in response to a second logic level to first logic level transition of an output signal of the first MUX;
a second flip-flop configured to sample the second logic level in response to the second logic level to first logic level transition of an output signal of the second MUX;
an OR gate configured to perform a logical OR operation on an output signal of the first flip-flop and an output signal of the second flip-flop to generate a deactivation signal; and
an inverter configured to invert the deactivation signal to generate an activation signal.

8. The current drive circuit of claim 1, wherein the current driver comprises:

a pMOS transistor configured to provide a current path between the drive node and a power voltage based on the first bit of the control signal;

an nMOS transistor configured to provide a current path between a ground and the drive node based on the second bit of the control signal;

a first current source configured to provide a current between the power voltage and the drive node; and a second current source configured to provide a current between the ground and the drive node.

9. The current drive circuit of claim 1, wherein the current driver comprises:

a first pMOS transistor configured to provide a current path between a power voltage and the drive node based on the first bit of the control signal;

a first nMOS transistor configured to provide a current path between a ground and the drive node based on the second bit of the control signal;

a second pMOS transistor configured to be diode-coupled, and configured to provide a current between the power voltage and the drive node; and a second nMOS transistor configured to be diode-coupled, and configured to provide a current between the ground and the drive node.

10. The current drive circuit of claim 1, wherein the current driver comprises:

a first pMOS transistor configured to provide a current path between a power voltage and the drive node based on the first bit of the control signal;

a first nMOS transistor configured to provide a current path between a ground and the drive node based on the second bit of the control signal;

a second nMOS transistor configured to be diode-coupled, and configured to provide a current between the power voltage and the drive node; and a second pMOS transistor configured to be diode-coupled, and configured to provide a current between the ground and the drive node.

11. A method of boosting a current comprising:

detecting a voltage level of a drive node;

comparing the voltage level of the drive node with a voltage level of a reference voltage to determine whether the voltage level of the drive node is smaller or larger than the voltage level of the reference voltage;

generating a comparison signal according to a result of the determination;

generating a control signal to provide a current for the drive node based on the comparison signal; and providing the current until the voltage level of the drive node becomes equal to an operating point based on the control signal, wherein the step of generating a control signal comprises:

activating a first bit of the control signal using a state transition of a first bit of the comparison signal when a mode of a current mode bus interface system transitions from a suspend mode to a normal operation mode;

activating a second bit of the control signal using a state transition of a second bit of the comparison signal when the mode of the current mode bus interface system transitions from the normal operation mode to the suspend mode;

deactivating the first bit of the control signal using the state transition of the first bit of the comparison signal after the first bit of the control signal is activated; and deactivating the second bit of the control signal using the state transition of the second bit of the comparison signal after the second bit of the control signal is activated.

12. The method of claim 11, wherein the method of boosting the current is used when the current mode bus interface system performs a mode transition from a suspend mode to a normal operation mode.

13. The method of claim 12, wherein the method of boosting the current is used for driving a reference current, a clock current and a data current of a host device of the current mode bus interface system.

14. The method of claim 11, wherein the step of generating a comparison signal comprises:

generating the reference voltage;

amplifying the voltage difference between the voltage level of the drive node and the voltage level of the reference voltage to generate the first bit of the comparison signal; and amplifying the voltage difference between the voltage level of the drive node and the voltage level of the reference voltage to generate the second bit of the comparison signal.

15. A method of boosting a current comprising:

detecting a voltage level of a drive node;

generating a reference voltage;

amplifying a voltage difference between the voltage level of the drive node and the voltage level of the reference voltage to generate a first bit of a comparison signal;

inverting the first bit of the comparison signal to generate a second bit of the comparison signal;

generating a control signal to provide a current for the drive node based on the comparison signal; and providing the current until the voltage level of the drive node becomes equal to an operating point based on the control signal, wherein the step of generating a control signal comprises:

activating a first bit of the control signal using a state transition of a first bit of the comparison signal when a mode of a current mode bus interface system transitions from a suspend mode to a normal operation mode;

activating a second bit of the control signal using a state transition of a second bit of the comparison signal when the mode of the current mode bus interface system transitions from the normal operation mode to the suspend mode;

deactivating the first bit of the control signal using the state transition of the first bit of the comparison signal after the first bit of the control signal is activated; and deactivating the second bit of the control signal using the state transition of the second bit of the comparison signal after the second bit of the control signal is activated.

16. A current mode bus interface comprising:

a current mode bus interface comprising a client and a host; and a current driver circuit comprising:

a differential voltage detector configured to detect a voltage level of a drive node and compare the voltage level of the drive node with a voltage level of a reference voltage to generate a comparison signal;

a control logic circuit configured to generate a control signal to provide a current to the drive node based on the comparison signal; and a current driver configured to provide the current for the drive node based on the control signal as a reference current to the client of the current mode bus interface, wherein the client performs a mode transition from a suspend mode to a normal mode in response to the reference current, and wherein the control logic circuit comprises:

a control signal generator configured to activate a first bit of the control signal using a state transition of a first bit of the comparison signal when a mode of a current mode bus interface system transitions from a suspend mode to a normal operation mode, and configured to activate a second bit of the control signal using a state transition of a second bit of the comparison signal when the mode of the current mode bus interface system transitions from the normal operation mode to the suspend mode; and a control signal reset circuit configured to deactivate the first bit of the control signal using the state transition of the first bit of the comparison signal after the first bit of the control signal is activated, and configured to deactivate the second bit of the control signal using the state transition of the second bit of the comparison signal after the second bit of the control signal is activated.

* * * * *